United States Patent [19] [11] Patent Number: 4,862,227
Tsuge et al. [45] Date of Patent: Aug. 29, 1989

[54] SEMICONDUCTOR DEVICE AND ITS MANUFACTURING METHOD

[75] Inventors: Kazunori Tsuge, Kobe; Shinji Kuwamura, Takasago; Yoshihisa Tawada, Kobe, all of Japan

[73] Assignee: Kanegafuchi Kagaku Kogyo Kabushiki Kaisha, Osaka, Japan

[21] Appl. No.: 298,282

[22] Filed: Jan. 17, 1989

Related U.S. Application Data

[63] Continuation of Ser. No. 832,621, Feb. 25, 1986, abandoned.

[30] Foreign Application Priority Data

Feb. 27, 1985 [JP] Japan .................................. 60-39909

[51] Int. Cl.$^4$ ...................... H01L 45/00; H01L 23/48; H01L 27/02
[52] U.S. Cl. .......................................... 357/2; 357/52; 357/65; 357/71
[58] Field of Search .................... 357/2, 71, 47, 52, 65

[56] References Cited

U.S. PATENT DOCUMENTS

| 4,161,744 | 7/1979 | Blaske et al. | 357/52 |
| 4,443,651 | 4/1984 | Swartz | 357/30 Q |
| 4,481,230 | 11/1984 | Hanak | 429/39 |
| 4,670,088 | 6/1987 | Tsaur et al. | 29/576 T |

Primary Examiner—Andrew J. James
Assistant Examiner—Ngan Van Ngo
Attorney, Agent, or Firm—Armstrong, Nikaido, Marmelstein, Kobovcik & Murray

[57] ABSTRACT

The present invention relates to a semiconductor device manufactured by removing a part of a semiconductor layer containing an amorphous semiconductor and which is formed over separate electrodes existing on the same substrate and characterized in that the mean oxygen content of the portion of the semiconductor adjacent the removed portion and 10 μm inward is in a range of 0.5–10 atom %, and to a manufacturing method for the semiconductor device characterized in that the semiconductor layer is removed partly in an oxidative environment by the use of laser ray means. The invention provides semiconductor devices diminished in leak current.

3 Claims, 1 Drawing Sheet

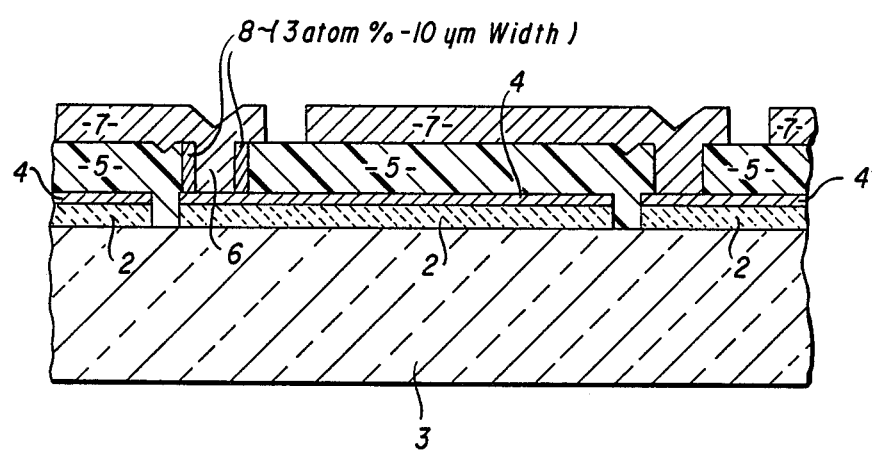

SEMICONDUCTOR DEVICE AND ITS MANUFACTURING METHOD

This application is a continuation of application Ser. No. 832,621 filed Feb. 25, 1986, now abandoned.

BACKGROUND OF THE INVENTION

1. Field of the Invention

The present invention relates to a semiconductor device and its manufacturing method and more particularly to a semiconductor device diminished in leak current and its manufacturing method.

2. Description of the Prior Art

Hitherto semiconductor devices have been manufactured by removing a part of a semiconductor layer formed over electrodes by the so-called laser scribing method.

Heat is generated when a part of the semiconductor layer is removed by the laser scribing method. When an amorphous semiconductor is included in the semiconductor layer, a marked increase of the electric conductivity results because a part of the amorphous semiconductor is micro-crystallized by the above-mentioned generated heat. As a result, when the semiconductor device is used as solar battery etc., it gives rise to a problem of increasing leak current and resultant lowering of performance. Especially when it is used as a solar battery of civil use, this leak current presents a large problem, causing a marked drop of performance.

SUMMARY OF THE INVENTION

It is an object of the present invention to provide a semiconductor device diminished in leak current.

Another object of the present invention is to provide a manufacturing method for manufacturing a semiconductor device diminished in leak current.

Further objects and advantages of the present invention will become apparent from a reading of the detailed description of the invention below.

After intensive studies the present inventors have arrived at the present invention for solving the problem of micro-crystallization of a part of the amorphous semiconductor which results in an increased electric conductivity of the semiconductor layer when a part thereof containing an amorphous conductor is removed by the so-called laser scribing method. The invention relates to a semiconductor device manufactured by removal of a part of a semiconductor layer containing an amorphous semiconductor formed over separate electrodes existing on the same substrate characterized in that the mean oxygen content of the semiconductor layer which has been subjected to laser scribing from the end face to 10 μm inward is 0.5–10 atom %. The invention also relates to a method of manufacturing a semiconductor device by removal of part of a semiconductor layer containing an amorphous semiconductor formd over the separate electrodes existing on the same substrate characterized in that part of the semiconductor layer is removed by the use of laser ray means in an oxidative environment.

BRIEF DESCRIPTION OF THE DRAWING

The drawing shows a section of a semiconductor device of the present invention as described in Example 1.

DETAILED DESCRIPTION OF THE INVENTION

As substrate useful in connection with the present invention are cited general substrates used for the manufacture of semiconductors such as those moulded of glass, ceramics, heat resistant high polymer films and heat resistant resins.

The electrodes that are formed electrically isolated on the above-mentioned substrate may be either transparent electrodes or general metal electrodes. As concrete examples may be cited electrodes used in manufacture of general semiconductor devices formed of ITO, $SnC_2$, Cr, Mo, W, Mg etc. ranging in film thickness from 200 Å to 2 μm or so.

The terminology semiconductor layer containing an amorphous semiconductor referred to in connection with the present invention is meant to include either amorphous semiconductors alone or semiconductors consisting of mixtures of amorphous and crystalline semiconductors, and when the semiconductor consists of a multiplicity of layers, at least one layer is meant to be formed of an amorphous semiconductor alone or be a mixture of amorphous and crystalline semiconductors. Such amorphous semiconductors or semiconductors consisting of mixtures of amorphous semiconductors and crystalline semiconductors have a characteristic of being generally low in electric conductivity compared with crystalline semiconductors.

As concrete examples of the above-mentioned amorphous semiconductors are cited, among others, amorphous silicon, amorphous silicon carbide, amorphous silicon nitride and amorphous silicon germanium and as concrete examples of semiconductors consisting of mixtures of amorphous semiconductors and crystalline semiconductors are cited, among others, microcrystalline silicon and fluorinated silicon (micro-crystalline), while as concrete examples of semiconductors containing amorphous semiconductors are cited, among others, amorphous silicon type semiconductors containing microcrystalline silicon formed on crystalline silicon.

Microcrystalline semiconductors referred to in the specification of the present invention include the so-called microcrystalline semiconductors, multicrystalline semiconductors.

When parts of the semiconductor layer containing amorphous semiconductors formed over the electrodes are removed by a conventional method such as the laser scribing method, the electric conductivity increases in, parts of the amorphous semiconductor adjacent to the semiconductor layer removed, because they are microcrystallized due to the influence of the heat generated during scribing. This results in an increase of leak current of the semiconductor device manufactured. Hence, in the semiconductor device of the present invention, increase of electric conductivity by microcrystallization is prevented by conducting removal of a part of the semiconductor layer containing the amorphous semiconductor by the laser scribing method in an oxidative environment and by controlling the mean oxygen content of the semiconductor or, preferably, amorphous semiconductor within 10 μm, preferably 50 μm, from the end face of the removed portion of the semiconductor layer in a range of 0.5–10 atom %, preferably 2–10 atom %.

The effect to prevent an increase of electric conductivity is insufficient if the width from the end face, in which the above-mentioned oxygen content is in the range of 0.5–10 atom %, is less than 10 μm or the oxygen content of the semiconductor is less than 0.5 atom %.

As concrete methods of forming an oxidative environment so as to conduct removal of a part of the semiconductor layer containing an amorphous semiconductor therein are, among others, blowing an oxidative gas such as oxygen or ozone at the location where a portion of the semiconductor layer is being removed, dripping or flowing an oxidative solution such as aqueous solution of hydrogen peroxide or permanganate, immersing the substrate with the semiconductor layer formed thereon in an oxidative solution or having an oxidative solution existing around the portion to be removed.

When the oxidative gas such as oxygen or ozone is used, it is preferred to use oxygen or ozone contained in oxygen, but it is also possible to use oxygen or ozone-containing oxygen diluted with an inert gas such as nitrogen and argon to a concentration of not less than 30 volume %. When an as oxidative solution such as aqueous solution of hydrogn peroxide or permanganate is used, it is advisable to have its concentration adjusted to 0.1–20 weight %.

When an oxidative gas is blown at the location where a part of the semiconductor layer is being removed or an oxidative solution is caused to exist there, the portion adjacent to the semiconductor layer removed is cooled, micro-crystallization of the amorphous semiconductor is prevented and increase of the electric conductivity is also prevented.

As equipment for removal of a part of the semiconductor layer are cited, e.g., Q switched YAG laser, carbon dioxide laser, argon laser and excimer laser, but these examples are not intended to be limiting.

Explained below is an embodiment of the present invention in which a part of a semiconductor layer is removed by the use of Q switched YAG laser.

Electrodes such as ITO and $SnO_2$ are formed on a glass substrate by, e.g., an electron beam vaporizing method and then the electrodes are separated by pattern etching. Then, a semiconductor layer containing an amorphous semiconductor is deposited over them by, e.g., an glow discharge decomposing method. Then, the substrate is set on an X-Y table with the semiconductor deposited side up and a part of the semiconductor layer is removed by the use of the Q switched YAG laser in an oxygen atmosphere formed by, e.g., introducing and blowing oxygen along the optical axis of the laser ray directed at the surface to be worked.

The operating conditions for the Q switched YAG laser, when the normal second high frequency (532 nm) is used, are: pulse frequency=2–5 KHz, preferably 3 KHz, mean output=0.07–2 W, preferably 0.1 W, mode=$TEM_{00}$, and pulse width=50–500 n sec., preferably 100–300 n sec.

Thus, the semiconductor layer containing an amorphous semiconductor formed over separate electrodes on a substrate is partly removed and further electrodes are formed thereon, patterned if necessary, to manufacture the semiconductor device of the present invention.

Described below by way of examples are the semiconductor device and the manufacturing method thereof of the present invention. Needless to say, however, the present invention is by no means limited thereto or thereby.

EXAMPLE 1

ITO (2) was deposited on a glass plate (3) 1.1 mm thick by an electron beam vaporizing method to a thickness of 800 Å and thereon $SnO_2$ (4) to a thickness of 200 Å, and separate electrodes were formed by a method called wet etching. Then a silicon semiconductor layer (5) consisting of p-type amorphous SiC:H/i-type amorphous Si:H/n-type and microcrystalline Si:H in thicknesses of 150 Å, 7,000 Å and 300 Å was formed by glow discharge decomposition method under conditions of a substrate temperature of 200° C., pressure of 0.5–1.0 Torr and RF power of 30 W. Thereafter, the substrate was set on an X-Y table with the semiconductor layer side up and a portion (6) of the semiconductor layer (0.15 mm wide) was removed by the use of the Q switched YAG laser with the table being moved at a speed of 50 mm/sec. and oxygen being blown at a rate of 10 lrs./min. along the optical axis of the laser ray against the surface irradiated.

The operating conditions of the Q switched YAG laser by the use of the 2nd high frequency (532 nm) were: pulse frequency=3 KHz, mean output=0.1 W, mode=$TEM_{00}$ and pulse width=200 n sec.

After laser scribing aluminum electrodes (7) were formed by vaporizing to a thickness of 5,000 Å and patterning was done by chemical etching.

A solar battery was made by series connecting 4 solar cells thus formed in the same plane. Its effective area was 1 $cm^2$ per cell, and 4 $cm^2$ in total.

The battery characteristics of the solar battery consisting of 4 solar cells thus obtained and connected serially were measured under a fluorescent lamp of 150 luxes. The result is shown in Table 1.

The oxygen content of the portion (8) of amorphous semiconductor from the laser scribed end face to 10 μm inward was measured by analysis by the photo-electronic spectro-photometer method, and the result was 3 atom %.

EXAMPLE 2

Instead of using oxygen in Example 1, a vat was set on an X-Y table, the substrate was put in the vat with the semiconductor layer side up and a 5% aqueous solution of hydrogen peroxide was poured into the vat until the surface of the semiconductor layer was 10 mm beneath the surface of the liquor and in otherwise the same method as Example 1 a part of the semiconductor layer was removed, a solar battery was made by series connecting 4 solar cells with an effective area of 1 $cm^2$ each and its battery characteristics were measured. Also, after laser scribing the oxygen content of the amorphous semiconductor portion between the end face and 10 μm inward was measured in the same way as Example 1. The results are shown in Table 1.

Control Example 1

In the same way as Example 1 except that oxygen was not used, the semiconductor layer was removed partly in atmosphere and a solar battery was made by series connecting 4 solar cells with an effective area of 1 $cm^2$ each and its battery characteristics were measured. After laser scribing the oxygen content of the portion of the semiconductor from the end face to 10 μm inward was measured in the same way as Example 1. The results are shown in Table 1.

TABLE 1

| Example | Solar battery characteristics (150 luxes) | | | Oxygen content (Atom %) |
| --- | --- | --- | --- | --- |
| | $I_{sc}$ (μA) | $V_{oc}$ (V) | $I_{op}$ (μA) (at 1.5 V) | |
| 1 | 12.8 | 2.62 | 10.9 | 3 |
| 2 | 12.5 | 2.60 | 10.6 | 5 |
| Control Example 1 | 12.7 | 2.15 | 8.1 | 0.2 |

From the data of Table 1 it is to be seen that when laser scribing is carried out with oxygen being blown at the portion being scribed as in Exampe 1, the layer affected by heat of the semiconductor layer containing an amorphous semiconductor is oxidized for its resistance to be increased even if it is micro-crystallized. Since the layer affected by heat is also cooled by oxygen and micro-crystallization is decreased, these together result in diminishing the leak current. It is also to be seen that the same effect as in Example 1 is obtainable by the use of an aqueous solution of hydrogen peroxide as in Example 2.

The semiconductor device manufactured by the method of the present invention is diminished in leak current and when it is used as a solar battery, it shows especially good battery characteristics even when it is used where luminous intensity is low such as indoors.

What we claim is:

1. A semiconductor device comprising a substrate, separate electrodes formed on the substrate and a semiconductor layer formed over the electrodes; said semiconductor layer: (1) comprising an amorphous semiconductor material and (2) being obtained by forming a layer comprising an amorphous semiconductor material over the electrodes and thereafter cutting through said layer with a laser scribe in an oxidative environment to form a scribed end face, the semiconductor layer having a mean oxygen content of 0.5–10 atom % in a portion thereof between the scribed end face and a distance 10–50 μm away from the scribed end face.

2. The semiconductor device of claim 1 wherein the mean oxygen content is 2.0 to 10 atom %.

3. The semiconductor device of claim 1 wherein the semiconductor layer has a mean oxygen content of 0.5 to 10 atom % in a portion thereof between the scribed end face and a distance 10 μm away from the scribed end face.

* * * * *